United States Patent
Choi et al.

(10) Patent No.: US 11,190,185 B2
(45) Date of Patent: Nov. 30, 2021

(54) IMPEDANCE CALIBRATION CIRCUIT AND SEMICONDUCTOR APPARATUS INCLUDING THE SAME

(71) Applicant: SK hynix Inc., Gyeonggi-do (KR)

(72) Inventors: Eun Ji Choi, Gyeonggi-do (KR); Jin Ha Hwang, Gyeonggi-do (KR); Keun Seon Ahn, Gyeonggi-do (KR); Yo Han Jeong, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/900,537

(22) Filed: Jun. 12, 2020

(65) Prior Publication Data

US 2021/0194485 A1    Jun. 24, 2021

(30) Foreign Application Priority Data

Dec. 18, 2019  (KR) .................. 10-2019-0169545

(51) Int. Cl.
*H03K 19/00* (2006.01)
*H03K 19/0185* (2006.01)

(52) U.S. Cl.
CPC . *H03K 19/0005* (2013.01); *H03K 19/018585* (2013.01)

(58) Field of Classification Search
CPC .................. H03K 19/0005; H03K 19/018585
See application file for complete search history.

(56) References Cited

U.S. PATENT DOCUMENTS

| | | | |
|---|---|---|---|
| 7,589,554 B2* | 9/2009 | Hamanaka | G11C 7/1048 326/30 |
| 8,476,923 B2* | 7/2013 | Jang | H03K 19/0005 326/30 |
| 8,710,861 B2* | 4/2014 | Kuroki | H04L 25/0278 326/30 |
| 9,356,581 B2 | 5/2016 | Jung | |
| 9,621,160 B2 | 4/2017 | Tang | |
| 2009/0002046 A1* | 1/2009 | Song | G11C 7/1057 327/285 |
| 2009/0289658 A1* | 11/2009 | Moon | G11C 5/063 326/30 |
| 2010/0308861 A1* | 12/2010 | Lee | H04L 25/0278 326/30 |
| 2011/0241653 A1* | 10/2011 | Kim | H03K 19/0005 324/76.83 |
| 2011/0267140 A1* | 11/2011 | Kim | H03H 11/30 327/594 |
| 2012/0002697 A1* | 1/2012 | Cho | G11C 7/1051 374/45 |

(Continued)

*Primary Examiner* — Kurtis R Bahr
(74) *Attorney, Agent, or Firm* — IP&T Group LLP

(57) ABSTRACT

An impedance calibration circuit may include: a first driver having an impedance calibrated according to a first impedance control code, and configured to drive an output terminal according to first data; a second driver having an impedance calibrated according to a second impedance control code, and configured to drive the output terminal according to second data; and an impedance calibration circuit configured to calibrate the first impedance control code to a first target value set to a resistance value of an external resistor, and calibrate the second impedance control code to a second target value different from the resistance value of the external resistor.

15 Claims, 12 Drawing Sheets

(56) References Cited

U.S. PATENT DOCUMENTS

| | | | |
|---|---|---|---|
| 2012/0146687 A1* | 6/2012 | Kim | H03K 19/0005 |
| | | | 326/30 |
| 2012/0169380 A1* | 7/2012 | Kang | G11C 7/1057 |
| | | | 327/108 |
| 2013/0154689 A1* | 6/2013 | Shon | H03K 5/2481 |
| | | | 327/90 |
| 2014/0002130 A1* | 1/2014 | Jang | H03K 17/166 |
| | | | 326/30 |
| 2015/0063041 A1* | 3/2015 | Arai | G11C 7/1051 |
| | | | 365/189.05 |
| 2015/0091611 A1* | 4/2015 | Jeong | H04L 25/028 |
| | | | 326/30 |
| 2017/0179953 A1* | 6/2017 | Hardee | H03K 19/0005 |

* cited by examiner

IMPEDANCE CALIBRATION CIRCUIT AND SEMICONDUCTOR APPARATUS INCLUDING THE SAME

CROSS-REFERENCE TO RELATED APPLICATION

The present application claims priority under 35 U.S.C. § 119(a) to Korean application number 10-2019-0169545, filed on Dec. 18, 2019, in the Korean Intellectual Property Office, which is incorporated herein by reference in its entirety.

BACKGROUND

1. Technical Field

Various embodiments generally relate to a semiconductor circuit, and more particularly, to an impedance calibration circuit and a semiconductor apparatus including the same.

2. Related Art

A semiconductor apparatus includes a transmitter circuit for transmitting data to an external source or location.

The transmitter circuit needs to be designed to implement various impedances to meet driving strength and termination characteristics indicated in the specification of the semiconductor apparatus.

SUMMARY

Various embodiments are directed to an impedance calibration circuit capable of increasing data transmission performance and a semiconductor apparatus including the same.

In an embodiment, an impedance calibration circuit may include: a first replica leg coupled to an external resistor, and having an impedance calibrated to a first target value equal to a resistance value of the external resistor according to a first impedance control code; a first code generation circuit configured to calibrate the value of the first impedance control code according to a result obtained by comparing the voltage of a first node, to which the first replica leg and the external resistor are coupled, to a reference voltage; a first replica leg having an impedance calibrated to a second target value different from the resistance value of the external resistor according to the first impedance control code; a third replica leg having an impedance calibrated to the second target value according to a second impedance control code; and a second code generation circuit configured to calibrate the value of the second impedance control code according to a result obtained by comparing the voltage of a second node, to which the second and third replica legs are coupled, to the reference voltage.

In an embodiment, a semiconductor apparatus may include: a first driver having an impedance calibrated according to a first impedance control code, and configured to drive an output terminal according to first data; a second driver having an impedance calibrated according to a second impedance control code, and configured to drive the output terminal according to second data; and an impedance calibration circuit configured to calibrate the first impedance control code to a first target value set to a resistance value of an external resistor, and calibrate the second impedance control code to a second target value different from the resistance value of the external resistor.

DETAILED DESCRIPTION

Hereinafter, an impedance calibration circuit and a semiconductor apparatus including the same are described below with reference to the accompanying drawings through various embodiments of the present invention. Throughout the specification, reference to "an embodiment" or the like is not necessarily to only one embodiment, and different references to any such phrase are not necessarily to the same embodiment(s).

Figure 1:
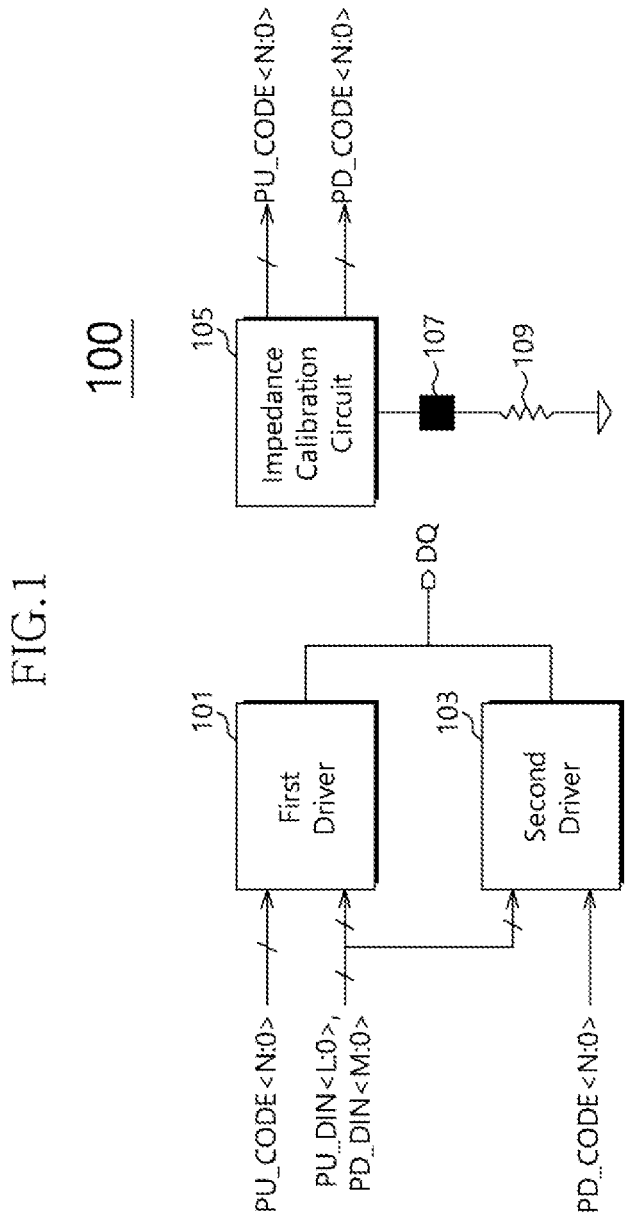
FIG. 1 is a diagram illustrating a configuration of a transmitter circuit of a semiconductor apparatus in accordance with an embodiment.

FIG. 1 is a diagram illustrating a configuration of a transmitter circuit of a semiconductor apparatus in accordance with an embodiment.

Referring to FIG. 1, the transmitter circuit 100 of the semiconductor apparatus may include a first driver 101, a second driver 103 and an impedance calibration circuit 105.

The impedance of the first driver 101 may be calibrated according to a first impedance control code PU_CODE<N:0>, and the first driver 101 may pull up an output terminal DQ according to data PU_DIN<M:0>.

The impedance of the second driver 103 may be calibrated according to a second impedance control code PD_CODE<N:0>, and the second driver 103 may pull down the output terminal DQ according to data PD_DIN<L:0>.

The impedance calibration circuit 105 may calibrate the first impedance control code PU_CODE<N:0> and the second impedance control code PD_CODE<N:0> to a target value set to a resistance value of an external resistor 109 coupled to an external resistor pad 107.

Hereafter, an example in which the first and second drivers 101 and 103 and the impedance calibration circuit 105 are designed to implement driving strength and termination impedances, which are defined in the specification of the semiconductor apparatus, when the resistance value of the external resistor 109 is set to 300 ohms is described with reference to FIGS. 2 to 6. In this example, N, L and M may be set to 3, 4 and 3, respectively (i.e., N=3, L=4 and M=3).

Figure 2:
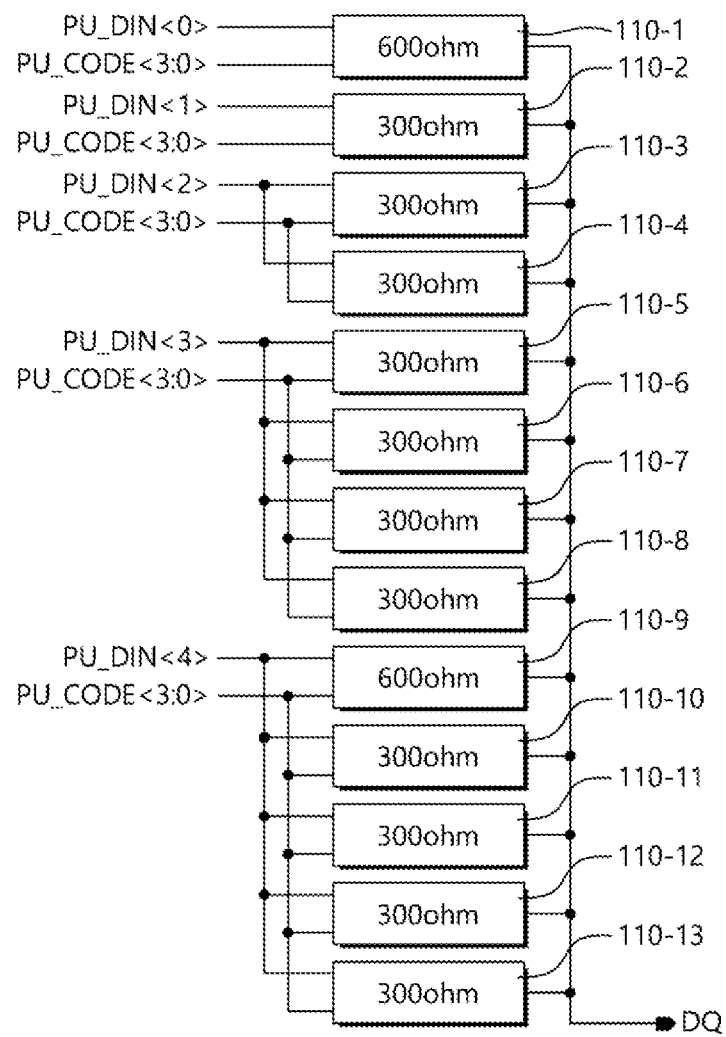
FIG. 2 is a diagram illustrating a configuration of a first driver of FIG. 1.

FIG. 2 is a diagram illustrating a configuration of the first driver of FIG. 1.

Referring to FIG. 2, the first driver 101 may include a plurality of pull-up legs 110-1 to 110-13.

The plurality of pull-up legs 110-1 to 110-13 may be coupled to the output terminal DQ in common.

Some of the plurality of pull-up legs 110-1 to 110-13 may be designed to each have and impedance twice the resistance value of the external resistor 109, and the others may be designed to each have an impedance corresponding to the resistance value of the external resistor 109.

FIG. 2 illustrates a design example of the first driver 101 when the resistance value of the external resistor 109 is set to 300 ohms. Some pull-up legs 110-1 and 110-9 of the plurality of pull-up legs 110-1 to 110-13 may each be designed to have an impedance of 600 ohms, and the other pull-up legs 110-2 to 110-8 and 110-10 to 110-13 may each be designed to have an impedance of 300 ohms.

The plurality of pull-up legs 110-1 to 110-13 may receive the first impedance control code PU_CODE<3:0> in common, and selectively receive the data PU_DIN<4:0>.

The data PU_DIN<4:0> may have the same value. However, data which are inputted to the other pull-up legs except pull-up legs selected according to the driving strength, among the data PU_DIN<4:0>, may be blocked.

For example, when the target value of the driving strength is 600 ohms during a pull-up operation, only the data PU_DIN<0> of the data PU_DIN<4:0> may be activated, and the other data PU_DIN<4:1> may be deactivated. The deactivation of the data PU_DIN<4:1> may be performed by clamping the respective data to a high level regardless of the original values thereof.

The first pull-up leg 110-1 may receive the first impedance control code PU_CODE<3:0> and the data PU_DIN<0>.

The second pull-up leg 110-2 may receive the first impedance control code PU_CODE<3:0> and the data PU_DIN<0>.

The third and fourth pull-up legs 110-3 and 110-4 may receive the first impedance control code PU_CODE<3:0> and the data PU_DIN<2> in common.

The fifth to eighth pull-up legs 110-5 to 110-8 may receive the first impedance control code PU_CODE<3:0> and the data PU_DIN<3> in common.

The ninth to 13th pull-up legs 110-9 to 110-13 may receive the first impedance control code PU_CODE<3:0> and the data PU_DIN<4> in common.

The plurality of pull-up legs 110-1 to 110-13 may be configured in the same manner, except that transistors constituting the pull-up leg having an impedance of 600 ohms and transistors constituting the pull-up leg having an impedance of 300 ohms have different sizes (gate widths). That is, a transistor in a 600 ohm pull-up leg has a different gate width than that of a transistor in a 300 ohm pull-up leg.

For example, a 300 ohm pull-up leg transistor may have a gate width twice that of a 600 ohm pull-up leg transistor. During a design process, the sizes of the transistors may be properly adjusted according to the impedance ratio.

Therefore, although the first impedance control code PU_CODE<3:0> having the same value is inputted, the impedances of the plurality of pull-up legs 110-1 to 110-13 may be matched with target values thereof, respectively.

Figure 3:
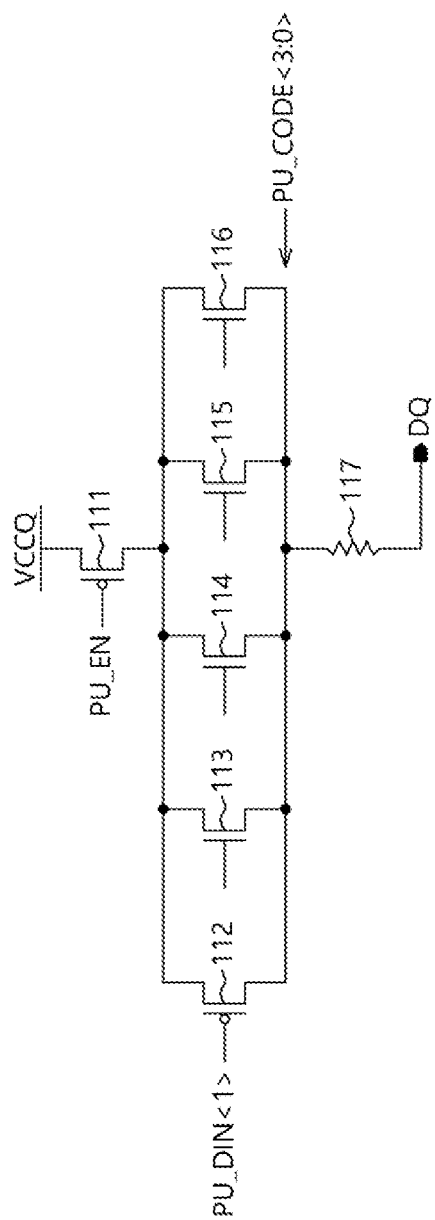
FIG. 3 is a diagram illustrating a configuration of a pull-up leg of FIG. 2.

FIG. 3 is a diagram illustrating a configuration of the pull-up leg of FIG. 2.

Referring to FIG. 3, the second pull-up leg 110-2 may include first to sixth transistors 111 to 116 and a resistor 117.

The first transistor 111 may have a source terminal coupled to a supply voltage terminal VCCQ and a gate terminal configured to receive a pull-up enable signal PU_EN.

The pull-up enable signal PU_EN may retain a low level to enable the transmitter circuit 100 of the semiconductor apparatus to normally operate while a data transmitting operation is performed, and retain a high level to prevent unnecessary current consumption while no data transmitting operation is performed.

The second transistor 112 may have a source terminal coupled to a drain terminal of the first transistor 111 and a gate terminal configured to receive the data PU_DIN<1>.

The third to sixth transistors 113 to 116 may have drain terminals coupled to the drain terminal of the first transistor 111 in common and gate terminals configured to receive the respective bits of the first impedance control code PU_CODE<3:0>.

The resistor 117 may have one end coupled to a drain terminal of the second transistor 112 and source terminals of the third to sixth transistors 113 to 116 in common and the other end coupled to the output terminal DQ.

The second pull-up leg 110-2 may pull up the output terminal DQ to the target impedance of 300 ohms, when the pull-up enable signal PU_EN is at a low level and the data PU_DIN<1> is at a low level.

Figure 4:
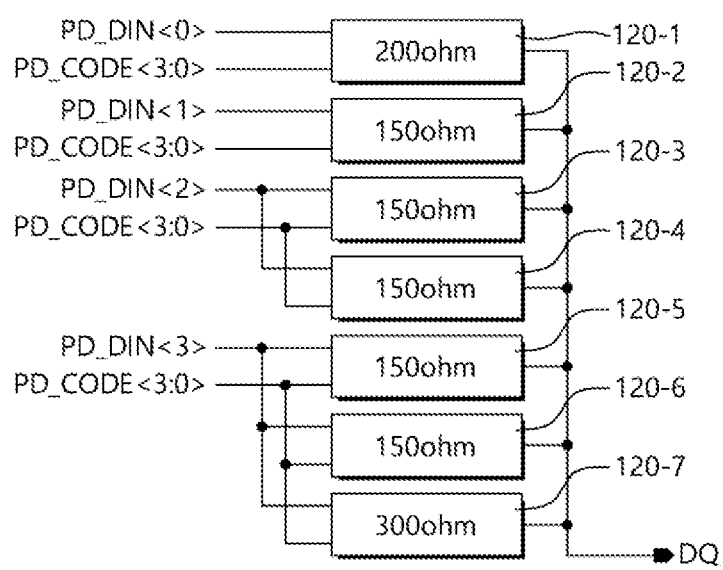
FIG. 4 is a diagram illustrating a configuration of a second driver of FIG. 1.

FIG. 4 is a diagram illustrating a configuration of the second driver of FIG. 1.

Referring to FIG. 4, the second driver 103 may include a plurality of pull-down legs 120-1 to 120-7.

The plurality of pull-down legs 120-1 to 120-7 may be coupled to the output terminal DQ in common.

Among the plurality of pull-down legs 120-1 to 120-7, the first pull-down leg 120-1 may be designed to have an impedance of 200 ohms, the second to sixth pull-down legs 120-2 to 120-6 may be designed to have an impedance of 150 ohms, and the seventh pull-down leg 120-7 may be designed to have an impedance of 300 ohms.

The plurality of pull-down legs 120-1 to 120-7 may receive the second impedance control code PD_CODE<3:0> in common, and selectively receive the data PD_DIN<3:0>.

The data PD_DIN<3:0> may have the same value. However, data which are inputted to the other pull-down legs except pull-down legs selected according to the driving strength, among the data PD_DIN<3:0>, may be blocked.

For example, when the target value of the driving strength is 200 ohms during a pull-down operation, only the data PD_DIN<0> of the data PD_DIN<3:0> may be activated, and the other data PD_DIN<3:1> may be deactivated. The deactivation of the data PD_DIN<3:1> may be performed by clamping the respective data to a low level regardless of the original values thereof.

The first pull-down leg 120-1 may receive the second impedance control code PD_CODE<3:0> and the data PD_DIN<0>.

The second pull-down leg 120-2 may receive the second impedance control code PD_CODE<3:0> and the data PD_DIN<1>.

The third and fourth pull-down legs 120-3 and 120-4 may receive the second impedance control code PD_CODE<3:0> and the data PD_DIN<2> in common.

The fifth to seventh pull-down legs 120-5 to 120-7 may receive the second impedance control code PD_CODE<3:0> and the data PD_DIN<3> in common.

The plurality of pull-down legs 120-1 to 120-7 may be configured in the same manner, except for size (gate width), which depends on the impedance of the transistor. That is, a 200 ohm pull-up leg transistor, a 150 ohm pull-down leg transistor, and a 300 ohm pull-down leg transistor each has a different size (gate width).

Figure 5:
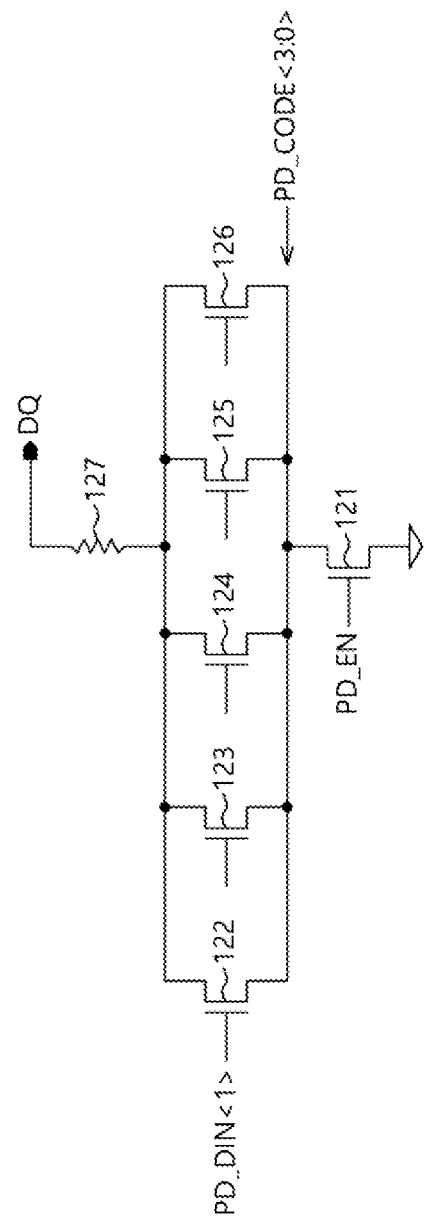
FIG. 5 is a diagram illustrating a configuration of a pull-down leg of FIG. 4.

FIG. 5 is a diagram illustrating a configuration of the pull-down leg of FIG. 4.

Referring to FIG. 5, the second pull-down leg 120-2 may include first to sixth transistors 121 to 126 and a resistor 127.

The first transistor 121 may have a source terminal coupled to a ground terminal and a gate terminal configured to receive a pull-down enable signal PD_EN.

The pull-down enable signal PD_EN may retain a high level to enable the transmitter circuit 100 of the semiconductor apparatus to normally operate while a data transmitting operation is performed, and retain a low level to prevent unnecessary current consumption while no data transmitting operation is performed.

The second transistor 122 may have a source terminal coupled to a drain terminal of the first transistor 121 and a gate terminal configured to receive the data PD_DIN<1>.

The third to sixth transistors 123 to 126 may have source terminals coupled to a drain terminal of the first transistor 121 in common and gate terminals configured to receive the respective bits of the second impedance control code PD_CODE<3:0>.

The resistor 127 may have one end coupled to drain terminals of the second to sixth transistors 122 to 126 in common and the other end coupled to the output terminal DQ.

The second pull-down leg 120-2 may pull down the output terminal DQ to a target impedance of 150 ohms, when the pull-down enable signal PD_EN is at a high level and the data PD_DIN<1> is at a high level.

Figure 6:
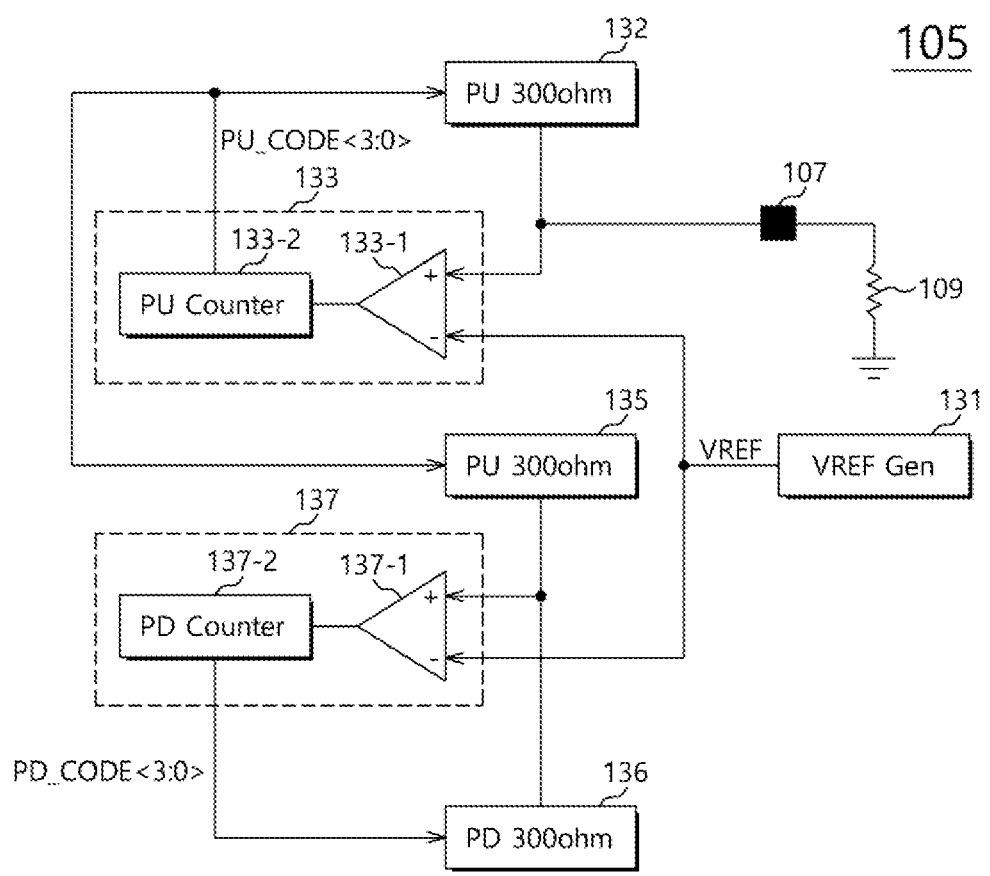
FIG. 6 is a diagram illustrating a configuration of an impedance calibration circuit of FIG. 1.

FIG. 6 is a diagram illustrating a configuration of the impedance calibration circuit of FIG. 1.

Referring to FIG. 6, the impedance calibration circuit 105 may include a reference voltage generation circuit (VREF Gen) 131, a first replica leg 132, a first code generation circuit 133, a second replica leg 135, a third replica leg 136 and a second code generation circuit 137. The reference voltage generation circuit 131 may generate a reference voltage VREF.

The reference voltage VREF may have a value corresponding to a half of a supply voltage VCCQ, i.e., VCCQ/2, for example.

The impedance of the first replica leg 132 may be calibrated according to the first impedance control code PU_CODE<3:0>.

The first replica leg 132 may be configured by replicating the second pull-up leg 110-2 of FIG. 2, for example.

The first replica leg 132 may be coupled to the external resistor 109 through the external resistor pad 107.

The first code generation circuit 133 may calibrate the value of the first impedance control code PU_CODE<3:0> according to a comparison result between the reference voltage VREF and the voltage of a node to which the first replica leg 132 and the external resistor 109 are coupled.

The first code generation circuit 133 may include a first comparator 133-1 and a first counter 133-2.

The first comparator 133-1 may compare the voltage of the node, to which the first replica leg 132 and the external resistor 109 are coupled, to the reference voltage VREF, and output the comparison result.

The first counter 133-2 may calibrate the value of the first impedance control code PU_CODE<3:0> according to the output of the comparator 133-1.

The impedance of the second replica leg 135 may be calibrated according to the first impedance control code PU_CODE<3:0>, and the second replica leg 135 may be configured in the same manner as the first replica leg 132.

The impedance of the third replica leg 136 may be calibrated according to the second impedance control code PD_CODE<3:0>. The third replica leg 136 may be configured by replicating the seventh pull-down leg 120-7 of FIG. 4, for example.

The second code generation circuit 137 may calibrate the value of the second impedance control code PD_CODE<3:0> according to a comparison result between the reference voltage VREF and the voltage of a node to which the second and third replica legs 135 and 136 are coupled.

The second code generation circuit 137 may include a second comparator 137-1 and a second counter 137-2.

The second comparator 137-1 may compare the voltage of the node, to which the second and third replica legs 135 and 136 are coupled, to the reference voltage VREF, and output the comparison result.

The second counter 137-2 may calibrate the value of the second impedance control code PD_CODE<3:0> according to the output of the second comparator 137-1.

Hereafter, the operation of the above-described impedance calibration circuit 105 is described as follows.

Since the external resistor 109 is configured outside the chip, the external resistor 109 may retain a constant resistance value of 300 ohms, regardless of the internal operation environment.

Therefore, an operation of calibrating the impedance of the first replica leg 132 to a target value set to the resistance value of the external resistor 109 may be performed.

As the values of the reference voltage VREF and the voltage of the node to which the first replica leg 132 and the external resistor 109 are coupled become the same within an error range, the calibration of the first impedance control code PU_CODE<3:0> may be completed.

Since the first impedance control code PU_CODE<3:0> is provided to the second replica leg 135, the impedance calibration operation for the second replica leg 135 may also be completed at the same time as the first replica leg 132.

Then, an operation of calibrating the impedance of the third replica leg 136 to the target value set to the impedance of the second replica leg 135 may be performed.

As the values of the reference voltage VREF and the voltage of the node to which the second and third replica legs 135 and 136 are coupled become the same within an error range, the calibration of the second impedance control code PD_CODE<3:0> may be completed.

Figure 7:
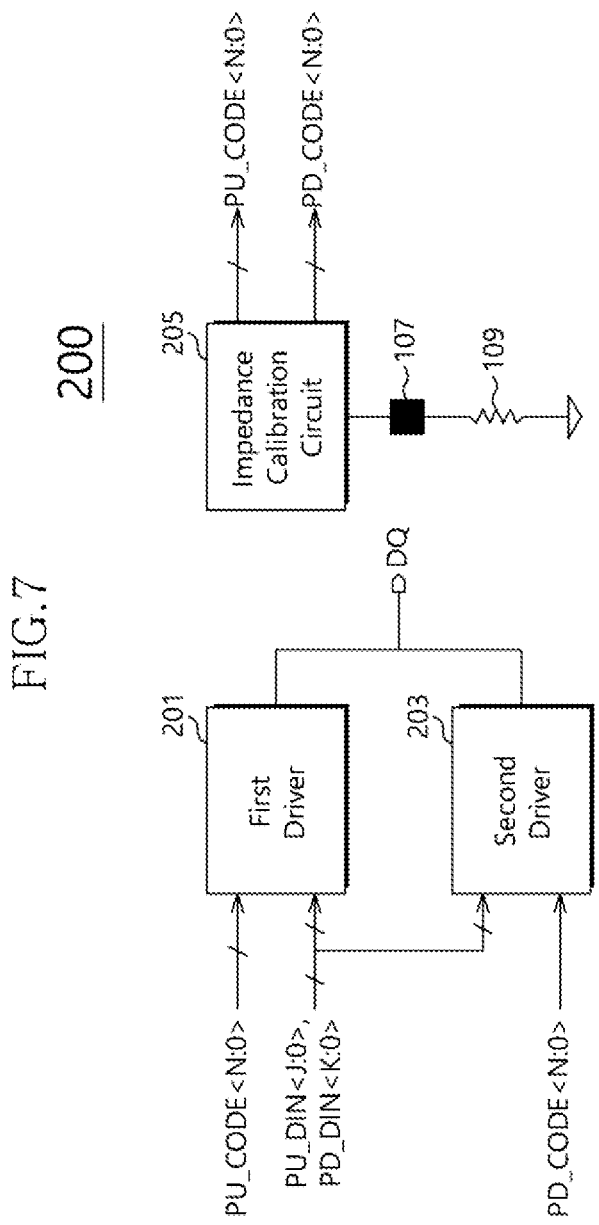
FIG. 7 is a diagram illustrating a configuration of a transmitter circuit of a semiconductor apparatus in accordance with an embodiment.

FIG. 7 is a diagram illustrating a configuration of a transmitter circuit of a semiconductor apparatus in accordance with an embodiment.

Referring to FIG. 7, the transmitter circuit 200 of the semiconductor apparatus may include a first driver 201, a second driver 203 and an impedance calibration circuit 205.

The impedance of the first driver 201 may be calibrated according to a first impedance control code PU_CODE<N:0>, and the first driver 201 may pull up an output terminal DQ according to data PU_DIN<J:0>.

The impedance of the second driver 203 may be calibrated according to a second impedance control code PD_CODE<N:0>, and the second driver 203 may pull down the output terminal DQ according to data PD_DIN<K:0>.

The impedance calibration circuit 205 may calibrate the first impedance control code PU_CODE<N:0> to a first target value set to a resistance value of an external resistor 109 coupled to an external resistor pad 107, and calibrate the second impedance control code PD_CODE<N:0> to a second target value set to a resistance value different from the resistance value of the external resistor 109.

The second target value may be set to a value different from the resistance value of the external resistor 109, for example, a value corresponding to ½ of the resistance value of the external resistor 109.

The configuration in which the second target value is set to ½ of the resistance value of the external resistor 109 is only an embodiment. The second target value is not limited to this resistance value, but may be set to any of various resistance values less than that of the external resistor 109.

Hereafter, an example in which the first and second drivers 201 and 203 and the impedance calibration circuit 205 are designed to implement driving strength and termination impedances, which are defined in the specification of the semiconductor apparatus, when the resistance value of the external resistor 109 is set to 300 ohms, is described with reference to FIGS. 8 to 12. In this example, N, J and K may be set to 3, 3 and 3, respectively (i.e., N=3, J=3 and K=3).

Figure 8:
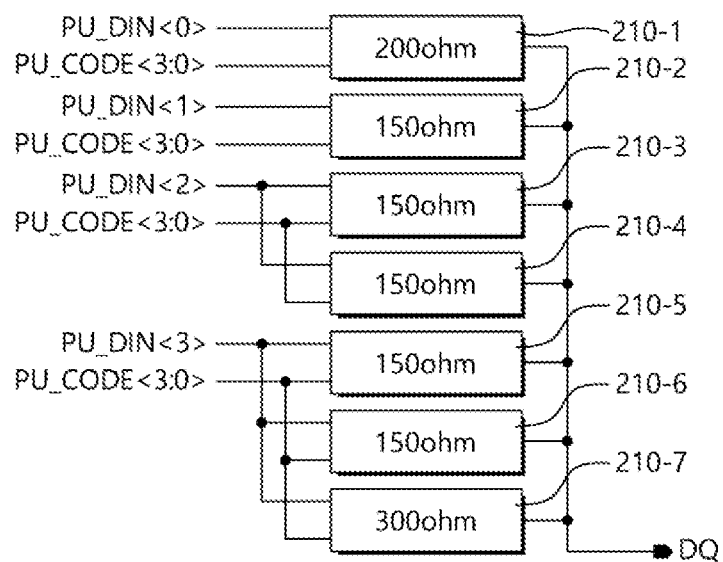
FIG. 8 is a diagram illustrating a configuration of a first driver of FIG. 7.

FIG. 8 is a diagram illustrating a configuration of the first driver of FIG. 7.

Referring to FIG. 8, the first driver 201 may include a plurality of pull-up legs 210-1 to 210-7.

The plurality of pull-up legs 210-1 to 210-7 may be coupled to the output terminal DQ in common.

Among the plurality of pull-up legs 210-1 to 210-7, the first pull-up leg 210-1 may be designed to have an impedance of 200 ohms which corresponds to ⅔ of the resistance value of the external resistor 109. The second to sixth pull-up legs 210-2 to 210-6 may be designed to have an impedance of 150 ohms which corresponds to ½ of the resistance value of the external resistor 109. The seventh pull-up leg 210-7 may be designed to have an impedance of 300 ohms which is equal to the resistance value of the external resistor 109.

The plurality of pull-up legs 210-1 to 210-7 may receive the first impedance control code PU_CODE<3:0> in common, and selectively receive the data PU_DIN<3:0>.

The data PU_DIN<3:0> may have the same value. However, data which are inputted to the other pull-up legs except pull-up legs selected according to the driving strength, among the data PU_DIN<3:0>, may be blocked.

For example, when the target value of the driving strength is 200 ohms during a pull-up operation, only the data PU_DIN<0> of the data PU_DIN<3:0> may be activated, and the other data PU_DIN<3:1> may be deactivated. The deactivation of the data PU_DIN<3:1> may be performed by clamping the respective data to a high level regardless of the original values thereof.

The first pull-up leg 210-1 may receive the first impedance control code PU_CODE<3:0> and the data PU_DIN<0>.

The second pull-up leg 210-2 may receive the first impedance control code PU_CODE<3:0> and the data PU_DIN<1>.

The third and fourth pull-up legs 210-3 and 210-4 may receive the first impedance control code PU_CODE<3:0> and the data PU_DIN<2> in common.

The fifth to seventh pull-up legs 210-5 to 210-7 may receive the first impedance control code PU_CODE<3:0> and the data PU_DIN<3> in common.

The plurality of pull-up legs 210-1 to 210-7 may be configured in the same manner, except for transistor sizes (gate widths), which depend on impedance. That is, a 200 ohm pull-up leg transistor, a 150 ohm pull-up leg transistor, and a 300 ohm pull-up leg transistor each has a different size (gate width).

For example, a transistor constituting the pull-up leg having an impedance of 150 ohms may have a gate width twice that of a transistor constituting the pull-up leg having an impedance of 300 ohms. During a design process, the sizes of the transistors may be properly adjusted according to the impedance ratio.

Therefore, although the first impedance control code PU_CODE<3:0> having the same value is inputted, the impedances of the plurality of pull-up legs 210-1 to 210-7 may be matched with the target values thereof, respectively.

Figure 9:
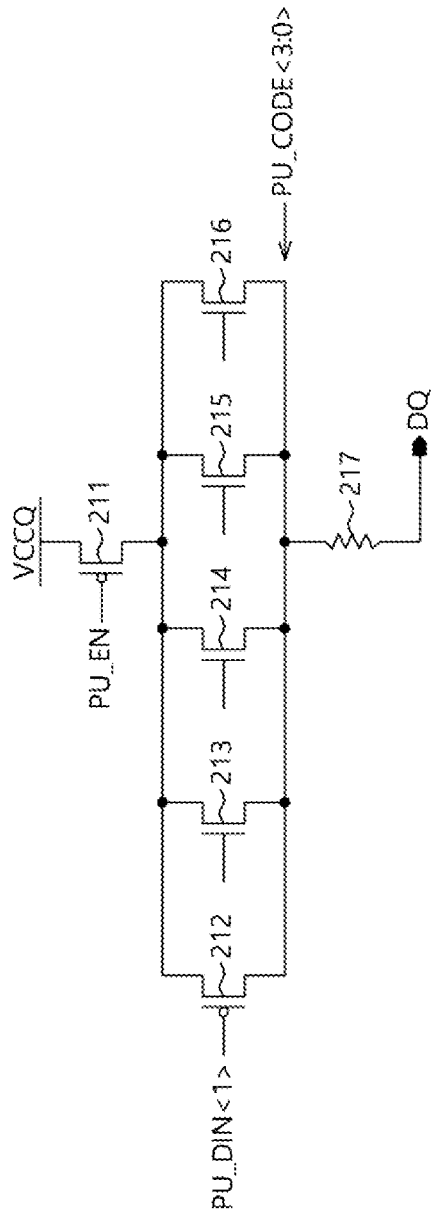
FIG. 9 is a diagram illustrating a configuration of a pull-up leg of FIG. 8.

FIG. 9 is a diagram illustrating a configuration of the pull-up leg of FIG. 8.

Referring to FIG. 9, the second pull-up leg 210-2 may include first to sixth transistors 211 to 216 and a resistor 217.

The first transistor 211 may have a source terminal coupled to a supply voltage terminal VCCQ and a gate terminal configured to receive a pull-up enable signal PU_EN.

While a data transmitting operation is performed, the pull-up enable signal PU_EN may retain a low level to enable the plurality of pull-up legs 210-1 to 210-7. When the plurality of pull-up legs 210-1 to 210-7 are enabled, the transmitter circuit 200 of the semiconductor apparatus may be normally operated. While no data transmitting operation is performed, the pull-up enable signal PU_EN may retain a high level to prevent unnecessary current consumption.

The second transistor 212 may have a source terminal coupled to a drain terminal of the first transistor 211 and a gate terminal configured to receive the data PU_DIN<1>.

The third to sixth transistors 213 to 216 may have drain terminals coupled to the drain terminal of the first transistor 211 in common and gate terminals configured to receive the respective bits of the first impedance control code PU_CODE<3:0>.

The resistor 217 may have one end coupled to a drain terminal of the second transistor 212 and source terminals of the third to sixth transistors 213 to 216 in common and the other end coupled to the output terminal DQ.

The second pull-up leg 210-2 may pull up the output terminal DQ to the target impedance of 150 ohms, when the pull-up enable signal PU_EN is at a low level and the data PU_DIN<1> is at a low level.

Figure 10:
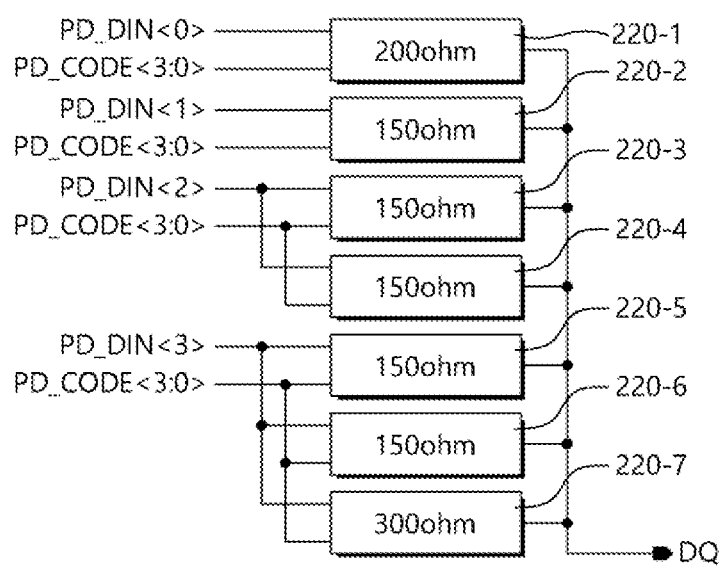
FIG. 10 is a diagram illustrating a configuration of a second driver of FIG. 7.

FIG. 10 is a diagram illustrating a configuration of the second driver of FIG. 7.

Referring to FIG. 10, the second driver 203 may include a plurality of pull-down legs 220-1 to 220-7.

The plurality of pull-down legs 220-1 to 220-7 may be coupled to the output terminal DQ in common.

Among the plurality of pull-down legs 220-1 to 220-7, the first pull-down leg 220-1 may be designed to have an impedance of 200 ohms, the second to sixth pull-down legs 220-2 to 220-6 may be designed to have an impedance of 150 ohms, and the seventh pull-down leg 220-7 may be designed to have an impedance of 300 ohms.

The plurality of pull-down legs 220-1 to 220-7 may receive the second impedance control code PD_CODE<3:0> in common, and selectively receive the data PD_DIN<3:0>.

The data PD_DIN<3:0> may have the same value. However, data which are inputted to the other pull-up legs except pull-up legs selected according to the driving strength, among the data PD_DIN<3:0>, may be blocked.

For example, when the target value of the driving strength is 200 ohms during a pull-down operation, only the data PD_DIN<0> of the data PD_DIN<3:0> may be activated, and the other data PD_DIN<3:1> may be deactivated. The deactivation of the data PD_DIN<3:1> may be performed by clamping the respective data to a low level regardless of the original values thereof.

The first pull-down leg 220-1 may receive the second impedance control code PD_CODE<3:0> and the data PD_DIN<0>.

The second pull-down leg 220-2 may receive the second impedance control code PD_CODE<3:0> and the data PD_DIN<1>.

The third and fourth pull-down legs 220-3 and 220-4 may receive the second impedance control code PD_CODE<3:0> and the data PD_DIN<2> in common.

The fifth to seventh pull-down legs 220-5 to 220-7 may receive the second impedance control code PD_CODE<3:0> and the data PD_DIN<3> in common.

Figure 11:
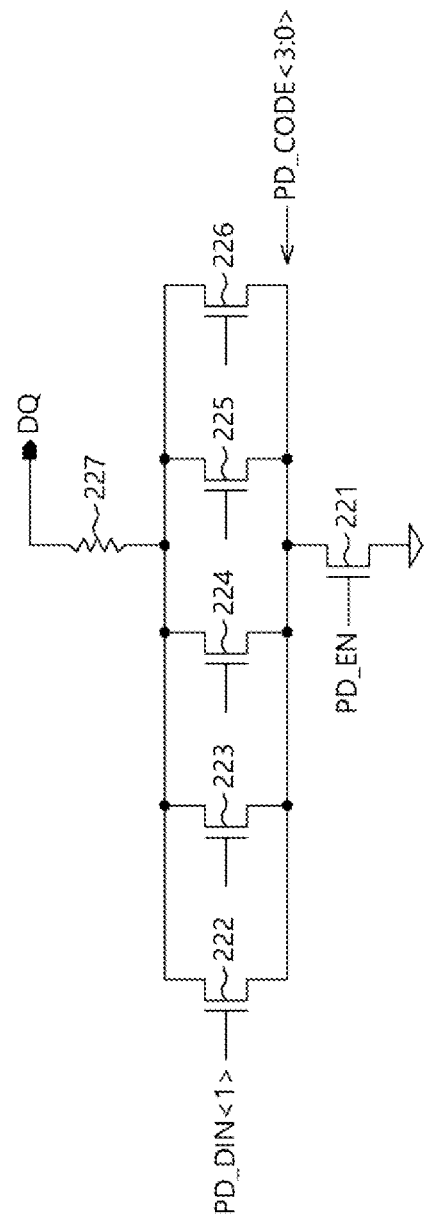
FIG. 11 is a diagram illustrating a configuration of a pull-down leg of FIG. 10.

FIG. 11 is a diagram illustrating a configuration of the pull-down leg of FIG. 10.

The plurality of pull-up legs 220-1 to 220-7 may be configured in the same manner, except for transistor size, which depends on impedance. That is, a 200 ohm pull-down leg transistor, a 150 ohm pull-down leg transistor, and a 300 ohm pull-down leg transistor, each has a different size (gate width).

Referring to FIG. 11, the second pull-down leg 220-2 may include first to sixth transistors 221 to 226 and a resistor 227.

The first transistor 221 may have a source terminal coupled to a ground terminal and a gate terminal configured to receive a pull-down enable signal PD_EN.

The pull-down enable signal PD_EN may retain a high level to enable the transmitter circuit 200 of the semiconductor apparatus to normally operate while a data transmitting operation is performed, and retain a low level to prevent unnecessary current consumption while no data transmitting operation is performed.

The second transistor 222 may have a source terminal coupled to a drain terminal of the first transistor 221 and a gate terminal configured to receive the data PD_DIN<1>.

The third to sixth transistors 223 to 226 may have source terminals coupled to a drain terminal of the first transistor 221 in common and gate terminals configured to receive the respective bits of the second impedance control code PD_CODE<3:0>.

The resistor 227 may have one end coupled to the drain terminals of the second to sixth transistors 222 to 226 in common and the other end coupled to the output terminal DQ.

The second pull-down leg 220-2 may pull down the output terminal DQ to a target impedance of 150 ohms, when the pull-down enable signal PD_EN is at a high level and the data PD_DIN<1> is at a high level.

Figure 12:
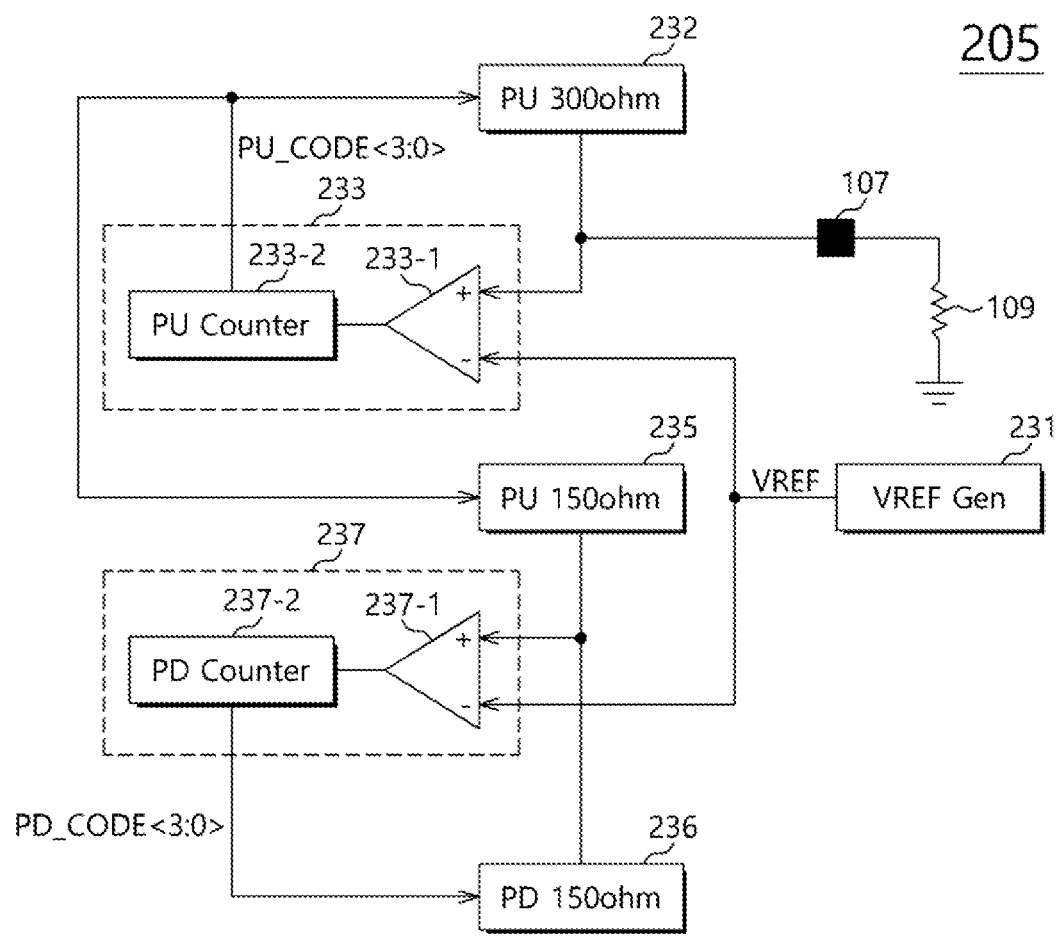
FIG. 12 is a diagram illustrating a configuration of an impedance calibration circuit of FIG. 7.

FIG. 12 is a diagram illustrating a configuration of the impedance calibration circuit of FIG. 7.

Referring to FIG. 12, the impedance calibration circuit 205 may include a reference voltage generation circuit (VREF Gen) 231, a first replica leg 232, a first code generation circuit 233, a second replica leg 235, a third replica leg 236 and a second code generation circuit 237.

The reference voltage generation circuit 231 may generate a reference voltage VREF.

The reference voltage VREF may have a value corresponding to a half VCCQ/2 of a supply voltage VCCQ, for example.

The impedance of the first replica leg 232 may be calibrated according to the first impedance control code PU_CODE<3:0>.

The first replica leg 232 may be configured by replicating the pull-up leg designed to have the same impedance as the first target value of 300 ohms, i.e., the resistance value of the external resistor 109. For example, the first replica leg 232 may be configured by replicating the design of the seventh pull-up leg 210-7 of FIG. 8.

The first replica leg 232 may be coupled to the external resistor 109 through the external resistor pad 107.

The first code generation circuit 233 may calibrate the value of the first impedance control code PU_CODE<3:0> according to a result of a comparison between the reference voltage VREF and the voltage of a node to which the first replica leg 232 and the external resistor 109 are coupled.

The first code generation circuit 233 may include a first comparator 233-1 and a first counter (PU Counter) 233-2.

The first comparator 233-1 may compare the voltage of the node, to which the first replica leg 232 and the external resistor 109 are coupled, to the reference voltage VREF, and output the comparison result.

The first counter 233-2 may calibrate the value of the first impedance control code PU_CODE<3:0> according to the output of the first comparator 233-1.

The impedance of the second replica leg 235 may be calibrated according to the first impedance control code PU_CODE<3:0>.

The second replica leg 235 may be configured by replicating the pull-up leg designed to have the same impedance as the second target value of 150 ohms corresponding to half of the resistance value (300 ohms) of the external resistor 109. For example, the second replica leg 235 may be configured by replicating the design of the second pull-up leg 210-2 of FIG. 8.

The impedance of the third replica leg 236 may be calibrated according to the second impedance control code PD_CODE<3:0>.

The third replica leg 236 may be configured by replicating the pull-down leg designed to have the same impedance as the second target value of 150 ohms, which is half of the resistance value (300 ohms) of the external resistor 109. For example, the third replica leg 236 may be configured by replicating the design of the second pull-down leg 220-2 of FIG. 10.

The second code generation circuit 237 may calibrate the value of the second impedance control code PD_CODE<3:0> according to a result of a comparison between the reference voltage VREF and the voltage of a node to which the second and third replica legs 235 and 236 are coupled.

The second code generation circuit 237 may include a second comparator 237-1 and a second counter (PD Counter) 237-2.

The second comparator 237-1 may compare the voltage of the node, to which the second and third replica legs 235 and 236 are coupled, to the reference voltage VREF, and output the comparison result.

The second counter 237-2 may calibrate the value of the second impedance control code PD_CODE<3:0> according to the output of the second comparator 237-1.

Hereafter, the operation of the above-described impedance calibration circuit 205 is described as follows.

Since the external resistor 109 is configured outside the chip, the external resistor 109 may retain a constant resistance value of 300 ohms, regardless of an internal operation environment.

First, an operation of calibrating the impedances of the first and second replica legs 232 and 235 to the first target value, i.e., the resistance value of the external resistor 109, may be performed.

As the values of the reference voltage VREF and the voltage of the node to which the first replica leg 232 and the external resistor 109 are coupled become the same within an error range, the calibration of the first impedance control code PU_CODE<3:0> may be completed.

As described above, a 150 ohm pull-up transistor may have a gate width twice that of a 300 ohm pull-up leg transistor, and the sizes of the transistors may be properly adjusted according to an impedance ratio during a design process. Therefore, an impedance calibration operation for the second replica leg 135 receiving the first impedance control code PU_CODE<3:0> may also be accurately completed at the same time as the first replica leg 132.

Then, an operation of calibrating the impedances of the third replica leg 236 to the second target value, i.e., a resistance value corresponding to ½ of the resistance value of the external resistor 109, may be performed.

As the values of the reference voltage VREF and the voltage of the node to which the second and third replica legs 235 and 236 are coupled become the same within an error range, the calibration of the second impedance control code PD_CODE<3:0> be completed.

The above-described impedance calibration circuit in accordance with an embodiment may calibrate the first impedance control code PU_CODE<3:0> and the second impedance control code PD_CODE<3:0> using the second and third replica legs 235 and 236 corresponding to half of the resistance value of the external resistor 109.

Therefore, as illustrated in FIG. 8, the number of pull-up legs in the first driver 201 may be reduced further than in first driver 101 of FIG. 2.

As the number of pull-up legs in the first driver 201 is reduced, various metal lines for coupling the pull-up legs to the output terminal DQ may be removed.

The reduction in the number of metal lines may reduce the capacitance of the output terminal DQ, and thus improve the data input/output operation speed.

While various embodiments have been illustrated and described, it will be understood to those skilled in the art that the embodiments described are examples only. Accordingly, the present invention is not limited by or to any of the described embodiments. Rather, the present invention encompasses all variations and modifications that fall within the scope of the claims.

What is claimed is:

1. An impedance calibration circuit comprising:
    a first replica leg coupled to an external resistor, and having an impedance calibrated, according to a first impedance control code, to a first target value equal to a resistance value of the external resistor;
    a first code generation circuit configured to calibrate a value of the first impedance control code according to a result obtained by comparing the voltage of a first node, to which the first replica leg and the external resistor are coupled, to a reference voltage;
    a second replica leg having an impedance calibrated, according to the first impedance control code, to a second target value different from the resistance value of the external resistor;
    a third replica leg having an impedance calibrated to the second target value according to a second impedance control code; and
    a second code generation circuit configured to calibrate a value of the second impedance control code according to a result obtained by comparing a voltage of a second node, to which the second and third replica legs are coupled, to the reference voltage.

2. The impedance calibration circuit of claim 1, wherein the first code generation circuit comprises:
    a comparator configured to compare the voltage of the first node to the reference voltage and output the comparison result; and
    a counter configured to calibrate the value of the first impedance control code according to the output of the comparator.

3. The impedance calibration circuit of claim 1, wherein the second target value is equal to half of the resistance value of the external resistor.

4. The impedance calibration circuit of claim 1, wherein the second code generation circuit comprises:
    a comparator configured to compare the voltage of the second node to the reference voltage and output the comparison result; and
    a counter configured to calibrate the value of the second impedance control code according to the output of the comparator.

5. A semiconductor apparatus comprising:
    a first driver having an impedance calibrated according to a first impedance control code, and configured to drive an output terminal according to first data;
    a second driver having an impedance calibrated according to a second impedance control code, and configured to drive the output terminal according to second data; and
    an impedance calibration circuit configured to calibrate the first impedance control code to a first target value, which is set to a resistance value of an external resistor, and calibrate the second impedance control code to a second target value different from the resistance value of the external resistor.

6. The semiconductor apparatus of claim 5, wherein the second target value is equal to half of the resistance value of the external resistor.

7. The semiconductor apparatus of claim 5, wherein the first driver comprises a plurality of pull-up legs that have an impedance corresponding to the second target value.

8. The semiconductor apparatus of claim 5,
    wherein the first driver comprises a plurality of pull-up legs,
    wherein each pull-up leg of a first subset of the plurality of pull-up legs has an impedance corresponding to ⅔ of the resistance value of the external resistor, each pull-up leg of a second subset of the plurality of pull-up legs has an impedance corresponding to ½ of the resistance value of the external resistor, and each pull-up leg of a third subset of the plurality of pull-up legs has an impedance equal to the resistance value of the external resistor.

9. The semiconductor apparatus of claim 5,
    wherein the first driver comprises a plurality of pull-up legs,
    wherein the plurality of pull-up legs are enabled according to a pull-up enable signal that retains a first logic level while a data transmitting operation is performed.

10. The semiconductor apparatus of claim 9, wherein the pull-up enable signal retains a second logic level in periods other than a period in which the data transmitting operation is performed, in order to block leakage currents of the plurality of pull-up legs.

11. The semiconductor apparatus of claim 5, wherein the second driver comprises a plurality of pull-down legs each having an impedance corresponding to the second target value.

12. The semiconductor apparatus of claim 5,
wherein the second driver comprises a plurality of pull-down legs,
wherein each pull-down leg of a first subset of the plurality of pull-down legs has an impedance corresponding to ⅔ of the resistance value of the external resistor, each pull-down leg of a second subset of the plurality of pull-down legs has an impedance corresponding to half of the resistance value of the external resistor, and each pull-down leg of a third subset of the plurality of pull-down legs has an impedance equal to the resistance value of the external resistor.

13. The semiconductor apparatus of claim 5,
wherein the first driver comprises a plurality of pull-down legs,
wherein the plurality of pull-down legs are enabled according to a pull-down enable signal that retains a second logic level while a data transmitting operation is performed.

14. The semiconductor apparatus of claim 13, wherein the pull-down enable signal retains a first logic level in periods other than a period in which the data transmitting operation is performed, in order to block leakage currents of the plurality of pull-down legs.

15. A semiconductor apparatus comprising:
a first driver configured to calibrate an impedance thereof according to a first code to drive an output terminal according to first data;
a second driver configured to calibrate an impedance thereof according to a second code to drive the output terminal according to second data;
a first pull-up leg coupled to a resistor, and configured to calibrate an impedance thereof to a resistance value of the resistor according to the first code;
a second pull-up leg configured to calibrate an impedance thereof to half the resistance value according to the first code;
a pull-down leg coupled to the second pull-up leg at a node, and configured to calibrate an impedance thereof to half the resistance value according to a second code; and
a code generation circuit configured to calibrate the first code based on a reference voltage and a voltage level of the resistor, and calibrate the second code based on the reference voltage and a voltage level of the node,
wherein the first driver includes plural pull-up legs each having an impedance half that of the resistance value.

* * * * *